United States Patent [19]

Sato

[11] Patent Number: 5,278,521
[45] Date of Patent: Jan. 11, 1994

[54] POWER SAVING FREQUENCY SYNTHESIZER WITH FAST PULL-IN FEATURE

[75] Inventor: Masujiro Sato, Tokyo, Japan

[73] Assignee: NEC Corporation, Tokyo, Japan

[21] Appl. No.: 932,941

[22] Filed: Aug. 21, 1992

[30] Foreign Application Priority Data

Aug. 23, 1991 [JP] Japan ................. 3-235648

[51] Int. Cl.⁵ .............................. H03L 7/18
[52] U.S. Cl. ........................ 331/14; 331/16; 331/17; 331/25; 455/343
[58] Field of Search ............ 331/14, 16, 17, 25; 455/343

[56] References Cited

U.S. PATENT DOCUMENTS 4,673,892  6/1987  Miyashita et al. ............ 331/14
4,841,255  6/1989  Ohba et al. ................... 331/14

*Primary Examiner*—Siegfried H. Grimm
*Attorney, Agent, or Firm*—Sughrue, Mion, Zinn, Macpeak & Seas

[57] ABSTRACT

In a frequency synthesizer, a first, variable frequency divider and a second frequency divider are activated in response to a periodic power activation pulse. The first frequency divider is driven by a voltage-controlled oscillator and the second frequency divider is driven by a reference frequency oscillator. A timing difference between the outputs of the first and second frequency dividers is detected and converted to a frequency-domain control signal for coupling to the voltage-controlled oscillator. Since the timing difference is converted to a frequency domain signal, the VCO is stabilized once there is a substantial frequency match between the first and second frequency dividers. Since the VCO can be stabilized thereafter, the frequency dividers can be deactivated when the detected timing difference is reduced to an acceptable value and are allowed to remain inactive until the synthesizer is activated again by the next activation pulse.

5 Claims, 1 Drawing Sheet

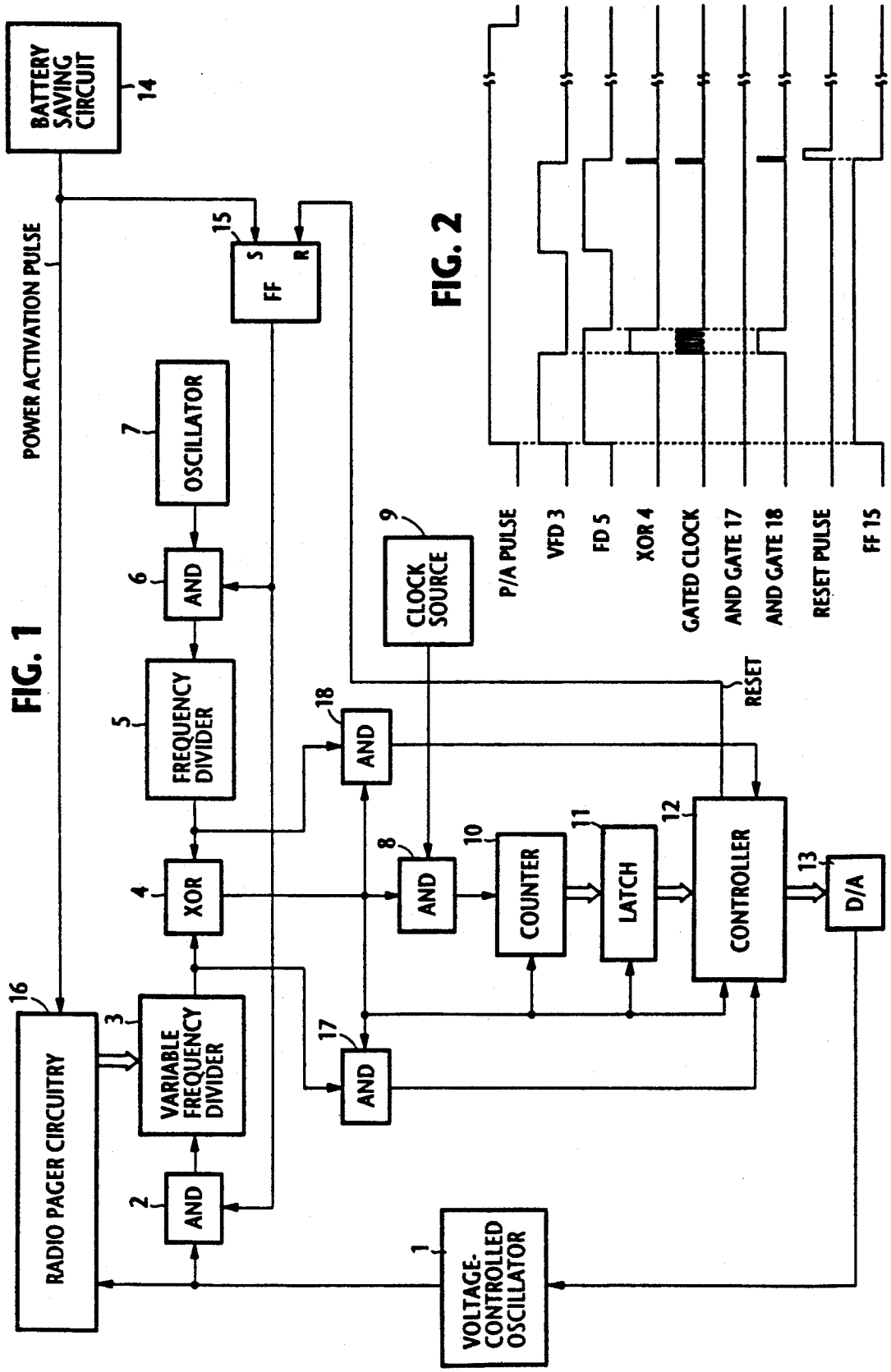

POWER SAVING FREQUENCY SYNTHESIZER WITH FAST PULL-IN FEATURE

BACKGROUND OF THE INVENTION

The present invention relates to a frequency synthesizer for an apparatus, such as radio pagers, having a battery savings feature.

In a frequency synthesizer employed in conventional radio pagers in which battery saving is effected, two frequency dividers are provided, one for dividing the frequency of an output of a voltage-controlled oscillator and the other for dividing the frequency of a reference frequency pulse from a reference frequency oscillator. The phase difference between the two pulses is detected by a phase comparator and supplied via a loop filter to the control input of the VCO. When the output of the variable frequency divider is phase-advanced with respect to the output of the other frequency divider, the phase comparator supplies a ground potential to the VCO to decrease its frequency; otherwise, a high voltage is applied to the VCO to increase its frequency. The frequency control in this manner will be repeated several times until the phase comparator produces no output. If the frequency synthesizer of this type is used in applications where its power supply is interrupted for power savings purposes during idle periods, it would take long to phase-lock the synthesizer each time its power circuit is reactivated. While this problem could be solved with the use of a capacitor for holding a voltage developed across the loop filter during an idle period and using it as a frequency control voltage at the start of the next active period, a prolonged power cutoff would cause the VCO and the reference frequency oscillator to develop a small frequency difference therebetween which, in turn, results in a substantial amount of phase difference (of 180 degrees, at worst) between the outputs of the frequency dividers on starting the synthesizer during the next active period. Such a phase drift would result in a maximum frequency control voltage, causing the VCO to produce large frequency excursions.

In addition, it is advantageous from the power savings view point to employ frequency dividers of high dividing ratios and to deactivate them immediately following the stabilization of the VCO. However, the phase comparator of the prior art synthesizer is so sensitive that it produces an output even though a small frequency difference develops between the outputs of the frequency dividers. Therefore, the frequency dividers of the prior art synthesizer cannot be deactivated during the active state of the synthesizer for power savings purposes.

SUMMARY OF THE INVENTION

It is therefore an object of the present invention to provide a frequency synthesizer which can quickly enter a phase lock state on starting the synthesizer and consumes less power.

According to the present invention, the frequency synthesizer is arranged to be activated in response to a periodic power activation pulse. The synthesizer comprises a voltage-controlled oscillator and a first, variable frequency divider for dividing the frequency of the output of the VCO at a ratio determined by an external circuit. A second frequency divider is provided for dividing the frequency of the output of a reference frequency oscillator at a predetermined ratio. A timing difference between the outputs of the first and second frequency dividers is detected and converted to a frequency-domain control signal for coupling to the voltage-controlled oscillator. The first and second frequency dividers are activated in response to the power activation pulse and deactivated when the detected timing difference is reduced to an acceptable value. Since the timing difference is converted to a frequency-domain signal, the VCO is stabilized once there is a substantial frequency match between the frequency dividers. Therefore, the frequency dividers are advantageously allowed to remain inactive until the synthesizer is activated again in response to the next power activation pulse.

BRIEF DESCRIPTION OF THE DRAWINGS

The present invention will be described in further detail with reference to the accompanying drawings, in which:

FIG. 1 is a block diagram of a frequency synthesizer of the present invention; and FIG. 2 is a timing diagram of the frequency synthesizer.

DETAILED DESCRIPTION

In FIG. 1, a frequency synthesizer of the present invention is shown incorporated in a radio pager having a battery saving circuit 14, which applies power activation pulses to the pager circuitry 16 at periodic intervals when the pager is in a standby mode. This power activation pulse is also applied to the set input of a flip-flop 15. The waveforms of signals appearing in the block diagram of FIG. 1 are shown in FIG. 2.

The frequency synthesizer comprises a variable frequency divider, or programmable counter 3 whose input is coupled through an AND gate 2 to the output of a voltage-controlled oscillator 1. Pager circuitry 16 supplies a frequency command signal to variable frequency divider 3 and receives synthesized clock frequency from the VCO 1. Frequency divider 3 divides the frequency of the output of VCO 1 coupled through AND gate 2 at a desired ratio in response to the frequency command signal and supplies its output to one input of an exclusive-OR gate 4. A frequency divider 5 is provided, the input of which is coupled through an AND gate 6 to receive a reference frequency pulse from a reference frequency oscillator 7 to divide its frequency at a predetermined ratio. The output of frequency divider 5 is applied to the other input of exclusive-OR gate 4. AND gates 2 and 6 are both enabled during the time the output of flip-flop 15 is high.

Thus, exclusive-OR gate 4 produces a pulse having a duration equal to the timing difference between the outputs of frequency dividers 3 and 5. The output of exclusive-OR gate 4 is used to enable an AND gate 8 to allow high-speed clock from a clock source 9 to be gated onto a binary counter 10 to produce a binary count of clock to represent the timing difference. The output of counter 10 is stored in a latch 11 in response to the leading edge of the output of exclusive-OR gate 4 and the counter 10 is reset in response to the trailing edge of the same output from the exclusive-OR gate. The stored count is fed into a controller 12 in response to the trailing edge of the output of the exclusive-OR gate in order to convert the binary count into an appropriate digital frequency control signal. This frequency control signal is converted to analog form by a digitalto-analog converter 13 and applied to the control input of VCO 1 so that the frequency difference between the two frequency dividers is reduced to a low value. If the original frequency difference is such an amount that a single feedback operation is sufficient to bring the frequency synthesizer into a locked state, controller 12 knows that the timing difference has reduced to a negligibly small value and supplies a reset pulse to the reset input of flip-flop as illustrated in FIG. 2. Otherwise, the process is repeated until the frequency difference is pulled into the allowable range. To allow controller 12 to determine the direction of frequency control, AND gates 17 and 18 are provided respectively for frequency dividers 3 and 5, with AND gate 17 having its input terminals respectively coupled to the outputs of frequency divider 3 and exclusive-OR gate 4, and AND gate 18 having its input terminals respectively coupled to the outputs of frequency divider 5 and exclusive-OR gate 4. The outputs of AND gates 17 and 18 are applied to controller 12. If the output frequency of divider 3 is higher than the output frequency of divider 5 as indicated in FIG. 2, then the AND gate 18 produces an output pulse having the same duration as the output of exclusive-OR gate 4, and controller 12 produces a frequency control signal that reduces the VCO frequency by an amount corresponding to the detected timing difference. If the output frequency of divider 3 is lower than the output frequency of divider 5, AND gate 17 will produces an output that causes controller 12 to increase the VCO frequency.

In this way, VCO control is accomplished in a short period of time following each activation cycle of the battery saving mode, and the operating time of frequency dividers 3 and 5, and hence their power consumption is reduced to a minimum.

What is claimed is:

1. A frequency synthesizer arranged to be activated in response to a periodic power activation pulse, comprising:
    a voltage-controlled oscillator;
    first, variable frequency divider means, arranged to be activated in response to said periodic pulse, for dividing the frequency of an output pulse from said voltage-controlled oscillator at a ratio determined by an external circuit to produce a variable frequency pulse, and arranged to be deactivated in response to a reset pulse;
    a reference frequency oscillator;
    second frequency divider means, arranged to be activated in response to said periodic pulse, for dividing the frequency of an output pulse from the reference frequency oscillator at a predetermined ratio to produce a reference frequency pulse, and arranged to be deactivated in response to said reset pulse;
    comparator means for detecting a timing difference between said variable frequency pulse and said reference frequency pulse; and
    control means for converting the detected timing difference to a frequency-domain control signal, applying the frequency-domain control signal to said voltage-controlled oscillator, and generating said reset pulse when the detected timing difference is reduced to an acceptable value.

2. A frequency synthesizer as claimed in claim 1, wherein said comparator means comprises an exclusive-OR gate responsive to said variable frequency pulse and said reference frequency pulse to produce an output pulse having a duration corresponding to said timing difference, and wherein said control means comprises:
    a clock source for generating clock pulses;
    counter means for counting clock pulses from said clock source during the presence of the output pulse of said exclusive-OR gate to produce a clock-count signal;
    means for converting said clock-count signal to a digital frequency control signal and generating said reset signal when the count indicated by said clock-count signal is smaller than a predetermined value; and
    a digital-to-analog converter for converting said digital frequency control signal to an analog frequency control signal and applying the analog frequency control signal to said voltage-controlled oscillator.

3. A radio pager comprising:
    battery saving means for producing a power activation pulse at periodic intervals during a standby mode of the pager;
    a voltage-controlled oscillator;
    first, variable frequency divider means, arranged to be activated in response to said power activation pulse, for dividing the frequency of an output pulse from said voltage-controlled oscillator at a desired ratio of said pager to produce a variable frequency pulse, and arranged to be deactivated in response to a reset pulse;
    a reference frequency oscillator;
    second frequency divider means, arranged to be activated in response to said power activation pulse, for dividing the frequency of an output pulse from the reference frequency oscillator at a predetermined ratio to produce a reference frequency pulse, and arranged to be deactivated in response to said reset pulse;
    comparator means for detecting a timing difference between said variable frequency pulse and said reference frequency pulse; and
    control means for converting the detected timing difference into a frequency-domain control signal, applying the frequency-domain control signal to said voltage-controlled oscillator, and generating said reset pulse when the detected timing difference is reduced to an acceptable value.

4. A radio pager as claimed in claim 3, wherein said comparator means comprises an exclusive-OR gate responsive to said variable frequency pulse and said reference frequency pulse to produce an output pulse having a duration corresponding to said timing difference, and wherein said control means comprises:
    a clock source for generating clock pulses;
    counter means for counting clock pulses from said clock source during the presence of the output pulse of said exclusive-OR gate to produce a clock-count signal;
    means for converting said clock-count signal to a digital frequency control signal and generating said reset signal when the count indicated by said clock-count signal is smaller than a predetermined value; and
    a digital-to-analog converter for converting said digital frequency control signal to an analog frequency control signal and applying the analog frequency control signal to said voltage-controlled oscillator.

5. In a frequency synthesizer arranged to be activated in response to a periodic power activation pulse, the synthesizer comprising a voltage-controlled oscillator;

first, variable frequency divider for dividing the frequency of an output pulse from said voltage-controlled oscillator at a ratio determined by an external circuit; a reference frequency oscillator; and a second frequency divider for dividing the frequency of an output pulse from the reference frequency oscillator at a predetermined ratio, a method for controlling said synthesizer, the method comprising the steps of:

a) activating said first and second frequency dividers in response to said power activation pulse;

b) detecting a timing difference between outputs of said first and second frequency dividers;

c) converting the detected timing difference to a frequency-domain control signal and applying the frequency-domain control signal to said voltage-controlled oscillator; and d) deactivating said first and second frequency dividers when the detected timing difference is reduced to an acceptable value.

* * * * *

UNITED STATES PATENT AND TRADEMARK OFFICE
CERTIFICATE OF CORRECTION

PATENT NO. :       5,278,521
DATED      :       January 11, 1994
INVENTOR(S) :      Masujiro SATO It is certified that error appears in the above-identified patent and that said Letters Patent is hereby corrected as shown below:

Column 3, line 9, after "flip-flop" insert --15--.

Signed and Sealed this

Sixteenth Day of August, 1994

Attest:

BRUCE LEHMAN

Attesting Officer      Commissioner of Patents and Trademarks